(12) United States Patent
Borland et al.

(10) Patent No.: US 7,649,361 B2
(45) Date of Patent: Jan. 19, 2010

(54) METHODS FOR FORMING PROCESS TEST CAPACITORS FOR TESTING EMBEDDED PASSIVES DURING EMBEDMENT INTO A PRINTED WIRING BOARD

(75) Inventors: William Borland, Chapel Hill, NC (US); Saul Ferguson, Albuquerque, NM (US); Diptarka Majumdar, Cary, NC (US); Daniel I. Amey, Durham, NC (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 583 days.

(21) Appl. No.: 11/612,089

(22) Filed: Dec. 18, 2006

(65) Prior Publication Data

US 2008/0145995 A1 Jun. 19, 2008

(51) Int. Cl.
*G01R 31/18* (2006.01)

(52) U.S. Cl. .................. 324/548; 324/658; 29/832; 29/25.03

(58) Field of Classification Search .............. 324/548, 324/658; 29/593, 832, 25.03; 438/381
See application file for complete search history.

(56) References Cited

U.S. PATENT DOCUMENTS 4,801,561 A * 1/1989 Sankhagowit ............... 29/827

* cited by examiner

*Primary Examiner*—Vincent Q Nguyen

(57) ABSTRACT

Making process test capacitors simultaneously with circuit capacitors that are to be embedded into a printed wiring board and firing the test capacitors to result in fired-on-foil test capacitors for the purpose of using the test capacitors as test substitutes for the embedded circuit capacitors to predict whether capacitance, dissipation factor or insulation resistance of the circuit capacitors will fall within acceptable specified ranges prior to and after embedment.

9 Claims, 9 Drawing Sheets

Electrical Model

Electrical Model

METHODS FOR FORMING PROCESS TEST CAPACITORS FOR TESTING EMBEDDED PASSIVES DURING EMBEDMENT INTO A PRINTED WIRING BOARD

BACKGROUND

1. Technical Field

The technical field relates to embedded capacitors made from thick-film, fired-on-foil dielectrics and electrodes in printed wiring boards ["PWB"] and semiconductor package substrates. More particularly, the technical field relates to creating process test capacitors simultaneously with the circuit capacitors to be embedded into PWB. The process test capacitors are test substitutes for embedded circuit capacitors to predict whether the capacitance, dissipation factor or insulation resistance of the circuit capacitors will be within acceptable specified ranges prior to and after embedment into PWB.

2. Related Art

As a known technology, embedding high capacitance density ["HCD"], thick-film capacitors in printed wiring boards and semiconductor package substrates promotes reduced circuit size and improved circuit performance. FIG. 1 illustrates a known method of making a multilayer printed wiring board having embedded thick-film, fired-on-foil capacitors. Although the formation of only two embedded circuit capacitors is shown, many capacitors may be formed on a foil by the known method.

FIG. 1A depicts the start of making an embedded thick-film circuit capacitor. A 1 oz (36 micron) copper foil 110 may be pretreated by applying a relatively thin (3-5 microns) underprint 112 of a copper paste to the capacitor side of the foil. Underprint 112 is dried at, for example, 120° C. for 10 minutes and then fired using copper thick-film firing conditions. The underprint is shown here as a surface coating. A recommended copper paste suitable for use as an underprint is EP 320, obtained from E.I. du Pont de Nemours and Company ["DuPont"].

With continuing reference to FIG. 1A, a thick-film capacitor dielectric material is screen printed onto the fired underprint 112, thereby forming a first printed pattern of capacitor dielectric layer 120. It is then dried at, for example 120° C. for 10 minutes. A suitable thick-film capacitor dielectric paste is EP 310, obtained from DuPont. After first thick-film dielectric layer 120 has been dried, second thick-film dielectric layer 125 (FIG. 1B) is screen printed over that and also dried.

FIG. 1C shows thick-film conductor layer 130 having been formed over second capacitor dielectric layer 125 as well as partially over foil 110. Conductive layer 130 may be formed by, for example, screen-printing the copper paste used to form underprint 112.

First and second capacitor dielectric layers 120 and 125 plus conductive material layer 130 are then co-fired under copper thick-film firing conditions to sinter the resulting structure together. During sintering, the two dielectric layers fuse together to form a single dielectric layer 128. FIG. 1D shows in plan view the resulting structure. At this stage, conductor layer 130 and foil 110 are connected and the capacitor is thus shorted. Therefore, the structure cannot function or be tested as a capacitor component. This is the foil stage.

FIG. 1E shows the patterned foil laminated with a suitable prepreg material 140 so that first electrode 130 faces the prepreg material. Another foil 160 may be applied to the opposite side of laminate prepreg material 140 to provide a surface for creating circuitry. After lamination, a photoresist is applied to foil 110 and foil 160, and the photoresists are imaged and developed.

Foils 110 and 160 are etched to form article 170 shown in FIG. 1F. Etching of the foil 160 creates copper pads 163 and 164. Etching of foil 110 creates trench 115. Trench 115 isolates second electrode 135 from conductor layer 130, connected to original foil 110, now 117. Second electrode 135, dielectric 128 and conductor layer 130—now first electrode 130 and connected to foil 117—form circuit capacitor 150. At this point, circuit capacitors 150 may be tested to ascertain if they meet electrical specifications by measuring the capacitance and/or other electrical properties between foil electrodes 135 and 117. This is the inner layer stage.

Referring to FIG. 1G, article 170 is laminated with other inner layer panels 175 to form multilayer structure 180. FIG. 1H shows vias 140 having been drilled to connect embedded circuit capacitors 150 to the outer layer copper foils, which have been etched to form copper pads 167, 168, etc., the whole article forming circuit board 190. Articles 180 and 190 may exhibit other layering designs than as shown in FIGS. 1G and 1H. For example, more layers may be added or microvias may be used to access the electrodes of the circuit capacitors.

The above known process has limits on circuit capacitor testing; specifically electrical properties of circuit capacitors cannot be tested until at least at the inner layer stage shown in FIG. 1F. However, by this stage several manufacturing steps have already occurred. Importantly, testing the electrical properties of the circuit capacitor at this stage is not even practicable when testing results in its damage or distortion. Thus, to end premature damage/distortion, testing of circuit capacitors is generally delayed until the finished printed circuit board stage in FIG. 1H.

However, this delay in testing fosters production waste and economic loss because certain properties of the circuit capacitors may have already been outside desired parameters at the foil stage at shown in FIG. 1D, or at the inner layer stage shown in FIG. 1F. The end result of the delay in testing is that, if upon testing at the conclusion of PWB fabrication, the electrical properties of the circuit capacitors are found outside the specified range, there is no alternative but to reject the entire board. It would be advantageous to know or predict whether certain electrical properties of the circuit capacitors are within desired ranges at earlier stages in the manufacture of the PWB This means that earlier testing that predicts circuit capacitors outside-of-specification promotes earlier discard of defective parts and reduces unnecessary economic loss.

SUMMARY

Described herein are methods for making a foil testable process test capacitor comprising:

providing metallic foil;

forming a process test dielectric over the metallic foil at the same time as and with the same material as are formed dielectric layers of circuit capacitors to be embedded into a printed wiring board or panel;

forming a process test electrode, the test electrode formed over and within the area of the test dielectric at the same time and with the same material as are formed electrodes of the circuit capacitors, to result in a process test capacitor, firing the process test capacitor under copper thick-film firing conditions at the same time as are fired the circuit capacitors, to result in foil having fired-on-foil process test capacitors.

This process test capacitor is tested at the foil stage of printed wire board production.

Also described are methods for making an inner layer process test capacitor, comprising:

provinding the foil testable process test capacitor;

laminating the foil of the foil testable test capacitor to a core or prepreg; and etching the metallic foil, thereby resulting in a functional process test capacitor.

This process test capacitor is tested at the inner layer stage of printed wire board production.

Also described are methods to predict whether certain electrical properties, namely, capacitance, dissipation factor and insulation resistance of circuit capacitors would be within acceptable ranges before these capacitors are embedded in a printed wiring board or panel thereof. These methods generally comprise setting acceptable ranges of values for the capacitance, dissipation factor or insulation resistance of circuit capacitors. A process test capacitor—either foil testable or inner layer testable—is then made at the same time as and in the same manner as a circuit capacitor. The test capacitor thus serves as a test substitute for the circuit capacitor. One or more of the electrical properties of the test capacitor is then measured and the values for these are compared with the acceptable values established for the circuit capacitors. Depending on what property is being measured, prediction is accomplished either through calculation of expected values from dielectric thicknesses or by direct measurement of the property with appropriate instrumentation.

In this way, the test capacitors described herein can be used to predict if circuit capacitors are within desired specifications for capacitance, dissipation factor and insulation resistance, at various stages of the printed wiring board fabrication process. Thus, the described test capacitors solve the technical problem by promoting at earlier stages in the manufacturing process a more critical analysis of defective circuit capacitors and their earlier discard, thereby achieving greater manufacturing efficiency. This contrasts with the current, inefficient method of analyzing the quality of the manufacturing process in which defective circuit capacitors and any articles containing them are removed only at the end of production. The methods described herein promote production efficiency and an informed, judicious pathway for achieving product quality not heretofore practiced.

BRIEF DESCRIPTION OF THE DRAWINGS

The detailed description of the methods described herein will refer to the following drawings wherein the various features of the drawings may not necessarily be drawn to scale. Dimensions of various features may be expanded or reduced to more clearly illustrate the embodiments of the invention.

DETAILED DESCRIPTION

The following methods are described herein with reference to the definitions provided below.

As used herein, "process test capacitor" or "test capacitor" refers to a capacitor not intended to be part of a circuit but is formed using the same materials at the same process steps as the circuit capacitors and can be tested to predict if the process of manufacture of the circuit capacitors is acceptable.

As used herein, "circuit capacitor" or "circuit embedded capacitor" refers to a capacitor contained within the printed wiring board that is an element of the desired circuit and performs an electrical function when the circuit is operating.

Figure 1A:
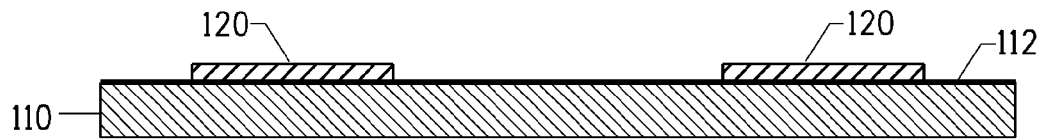
FIG. 1 illustrates a KNOWN process for making embedded circuit capacitors using thick-film fired on foil techniques.
Figure 1B:
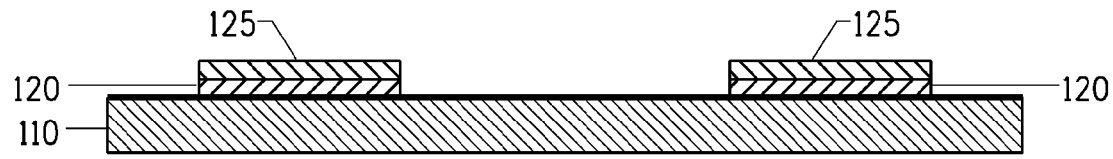
Figure 1C:
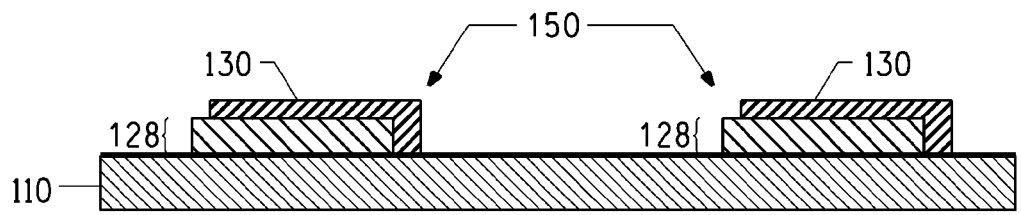
Figure 1D:
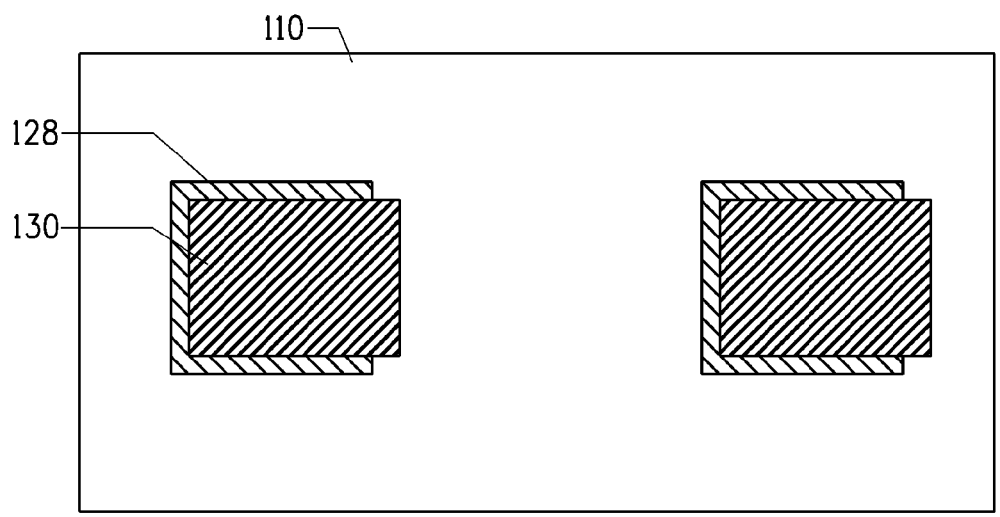
Figure 1E:
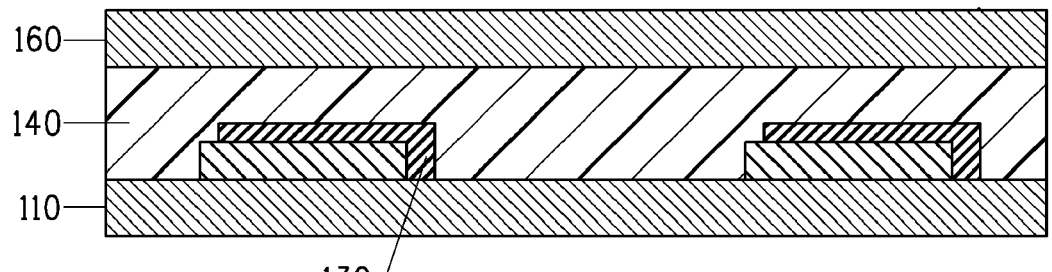

As used herein, "foil stage" or "fired foil stage" refers to the stage of PWB manufacture which FIG. 1D exemplifies, wherein capacitors on foil have been fired under copper thick-film firing conditions.

Figure 1F:
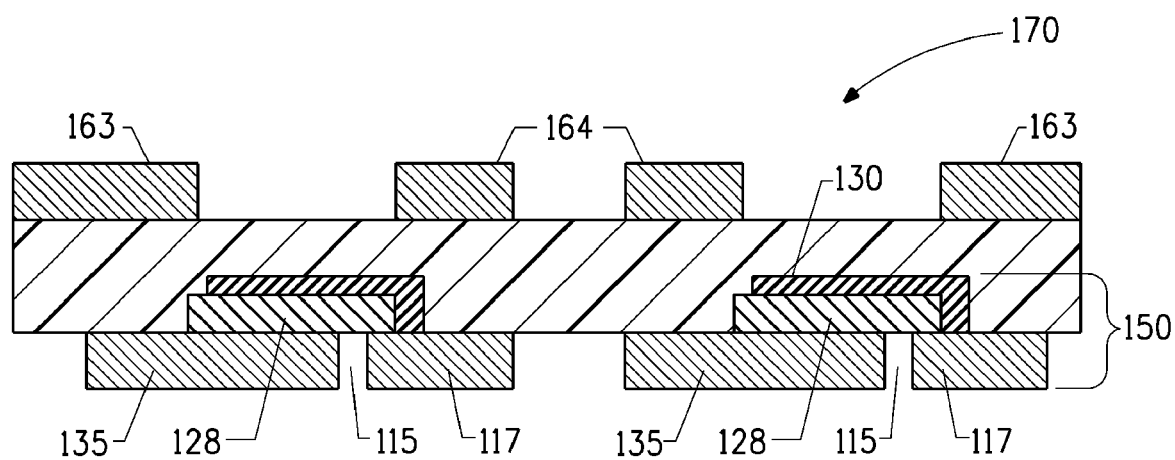
Figure 1G:
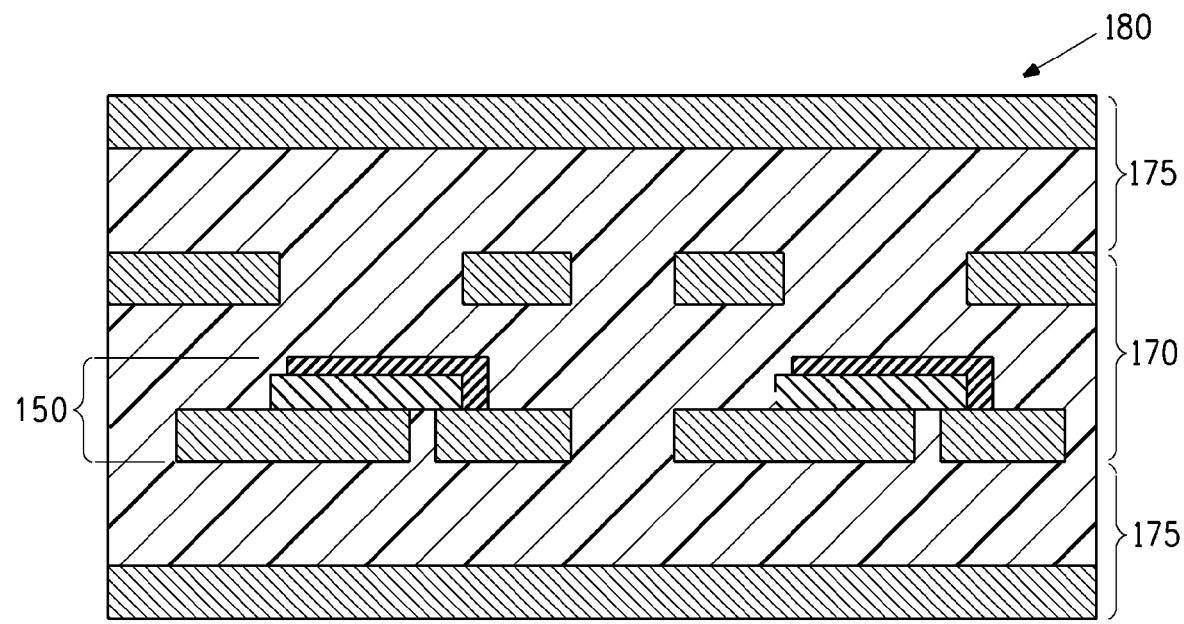
Figure 1H:
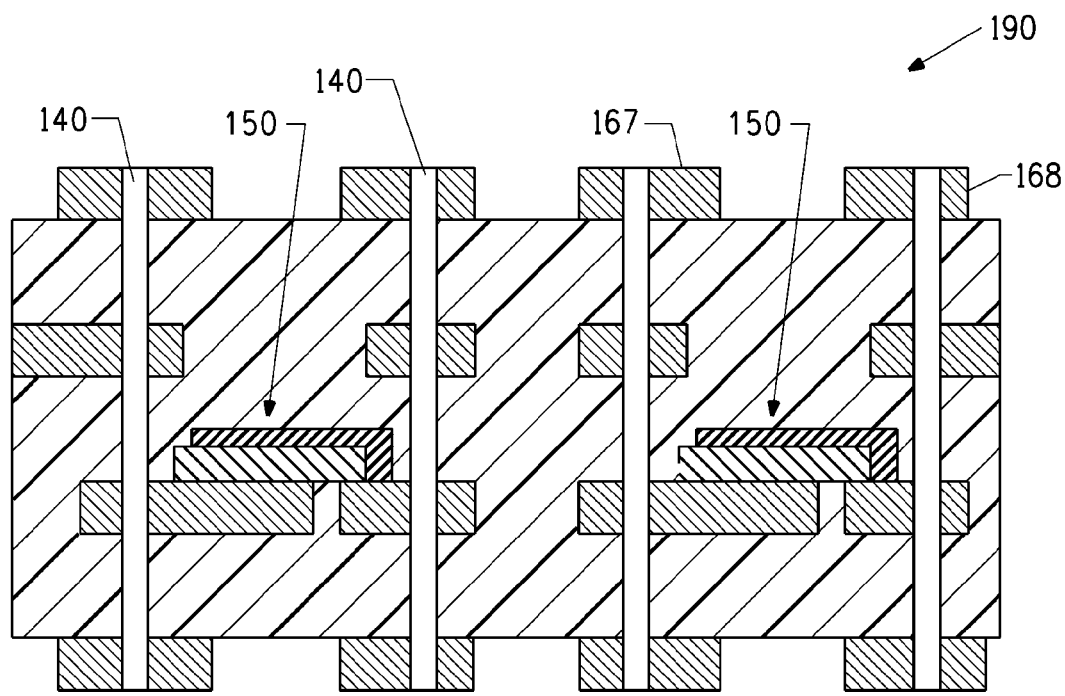

As used herein, "inner layer stage" refers to the stage of PWB manufacture which FIG. 1F exemplifies, wherein functioning capacitors are embedded in a single layer of prepreg material which has fully formed circuitry on each side created from copper foil that had previously been laminated to or with the prepreg material.

As used herein, "copper thick-film firing conditions" refers to annealing at a temperature of approximately 900 to 950° C. for approximately 10 minutes in an atmosphere that is sufficiently low in oxygen to prevent serious oxidation of the copper foil. Such atmospheres may comprise predominately nitrogen.

As used herein, "functional" process test capacitors refers to a working capacitor that can be tested for electrical properties.

As used herein, "printed wiring board panel" or "inner layer panel" refers to the article at the inner layer stage of PWB manufacture that comprises one or more printed wiring boards.

Described herein are methods for making process test capacitors that may be used to predict whether circuit capacitors are within specifications for certain electrical properties at various stages of their embedment into a PWB. Consequently, foils that contain defective capacitors may be discarded earlier in the manufacturing process to avoid unnecessary expense in processing defective parts. Additionally, such testing can identify deleterious process steps and suggest possible process improvements.

In these methods, the process test capacitors (a) are processed on the same foil using the same materials as the circuit capacitors and at the same process steps as the circuit capacitors destined for embedment into the PWB; and (b) are testable earlier than circuit capacitors inasmuch as they are not shorted in their initial fabrication steps, as circuit capacitors are. To the point, these methods make a fired-on-foil process test capacitor that is testable both at the foil stage and after the subsequent processing, at the inner layer stage. Thus, these methods can identify steps in PWB manufacturing which create waste or trigger quality concerns.

Figure 2:
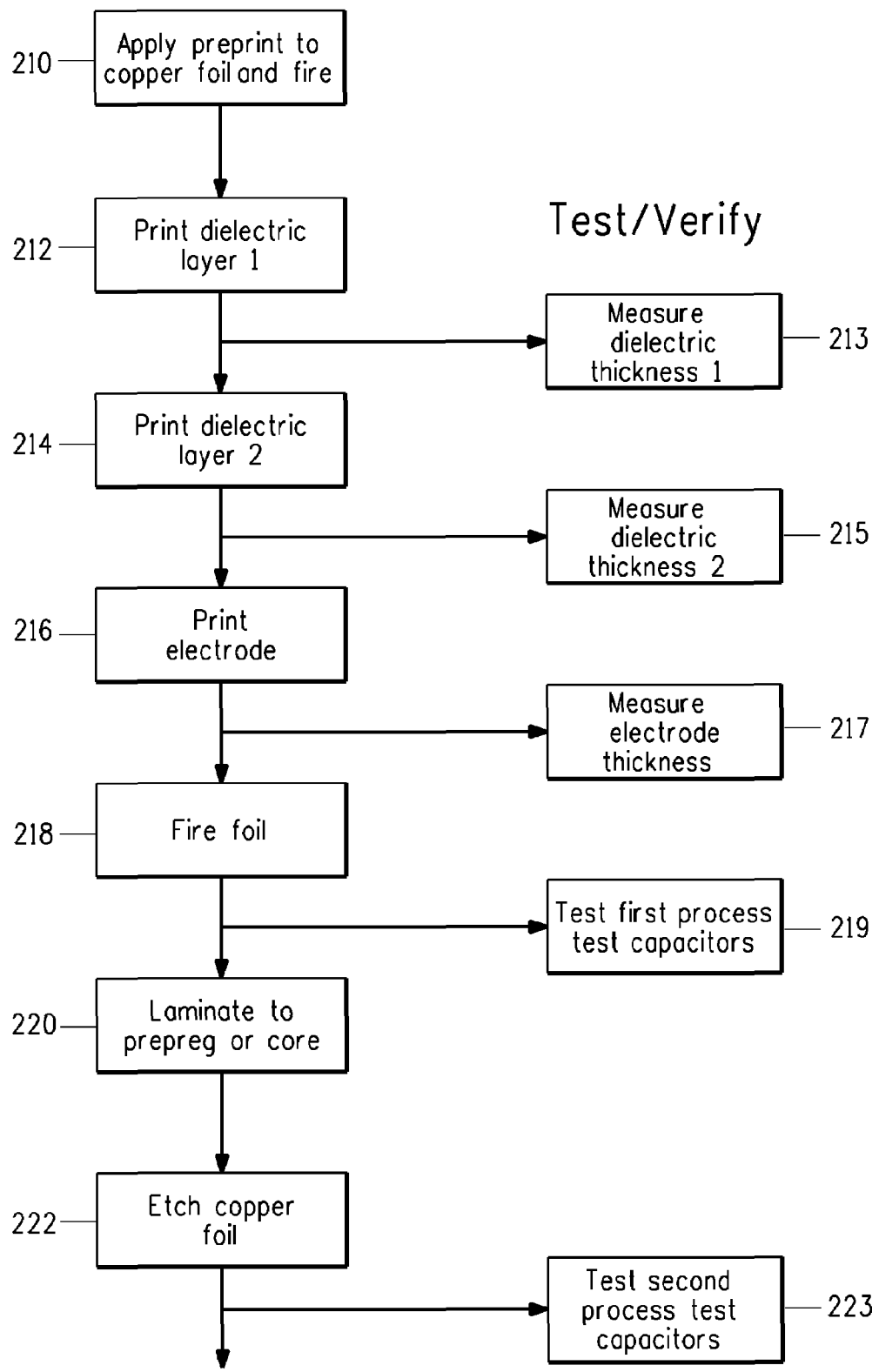
FIG. 2 is a block diagram of the process steps of making an inner layer containing an embedded capacitor showing where in the process it is desirable to test capacitors for physical and electrical data.

With reference to FIG. 2, steps 210-223 chart the flow of steps for making process test capacitors and embedded circuit capacitors and defines opportunities for testing the capacitance or other characteristics of the process test capacitors at various stages of embedment. With continuing reference to FIG. 2, FIG. 3 graphically illustrates in cross section the steps of FIG. 2 and depicts a method for preparing a first process test capacitor on metallic foil, which can be tested for electrical properties at the fired foil stage (FIG. 2, step 219; FIG. 3D). The following discussion outlines the steps of the method charted in FIG. 2 and relates these to the corresponding elements depicted in FIG. 3.

Figure 3A:
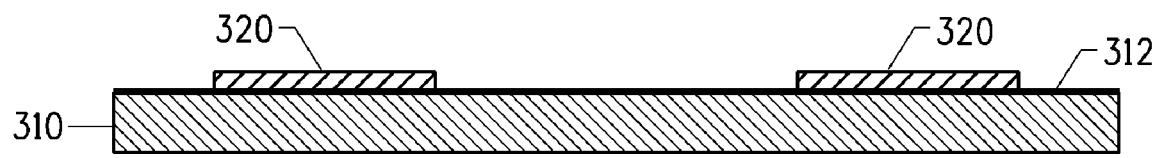
FIG. 3 depicts the process of preparing a fired process test capacitor on a metallic foil testable at the foil stage.

At step 210 in FIG. 2, and now referring to FIG. 3A metallic foil 310 (which may be copper) may be pretreated by applying and firing under copper thick-film firing conditions underprint 312. The circuit capacitor dielectric is deposited and dried on underprint 312. This is known art, illustrated in FIG. 1A as dielectric layer 120. In the same printing step, 212, and using the same dielectric material, a test capacitor dielectric layer is deposited and dried over the underprint 312 of pretreated foil 310, forming first test capacitor dielectric layer 320.

Figure 3B:
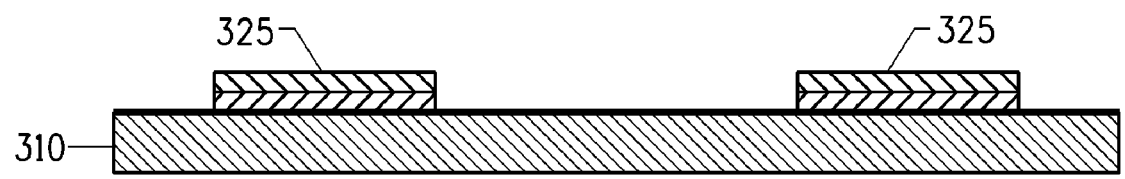

At step 214, and now referring to FIG. 3B, a second test capacitor dielectric layer 325 is applied over first layer 320 and dried at the same time and using the same materials as deposition of the second dielectric layer of circuit capacitors, depicted as dielectric layer 125 in the known deposition process of circuit capacitors shown in FIG. 1B. The final, dried dielectric thickness of the test capacitor may also be measured at this stage, which is pre-firing.

Measuring the thickness of the first dry print of the test capacitor dielectric at step 213 and/or of the second dry print at step 215 can predict if the capacitance of the circuit capacitor (to be embedded further on in the production) will fall within a target range. Thickness measurements may be made with a micrometer, profilometer or other acceptable method. It is well known in the art how to calculate the capacitance from the thickness of the dried, thick-film dielectric print and the common electrode area of the capacitor when the dielectric constant of the dielectric is known. Knowing the dried-to-fired shrinkage ratio that a particular dielectric exhibits on firing allows the prediction of the fired thickness. From that, the expected capacitance may be calculated from the following formula:

$$C_{nF} = 0.885 \, K \, A/t$$

where $C_{nF}$ is the capacitance in nanoFarads, K is the relative dielectric constant, A is the common electrode area in $cm^2$, and t is the fired dielectric thickness in microns.

Therefore, if the first print (and/or second print) of the test capacitor dielectric is not within a predetermined thickness range, then given the known dried-to-fired shrinkage ratio of the printed dielectric, it is well known how to calculate that the capacitance of the circuit capacitor will also not be within the target range. In this way, measuring the first/second prints of the test capacitor dielectric predicts that the circuit capacitors will not achieve a target capacitance, allows the discard of the printed foil and avoids further production with already defective components.

Figure 3C:
Figure 3D:
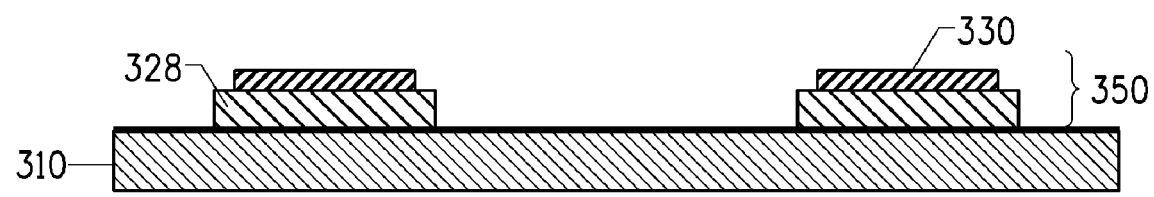

At step 216, and now referring to FIG. 3C, a thick-film copper paste is applied over layer 325 to form first printed electrode 330 at the same time and using the same copper paste as the circuit capacitor conductive layer 130 as depicted in FIG. 1C of the known art. Layer 330 is patterned to be within the area of dielectric layer 325. After drying layer 330, it may also be tested for thickness at step 217. If the first printed electrode 330 is too thin, the capacitor may suffer from insufficient capacitance after firing. If electrode 330 is too thick, cracking may occur during firing due to stresses caused in the firing process.

At step 218, first capacitor dielectric layer 320, second capacitor dielectric layer 325, and conductive layer (first printed electrode) 330 are then co-fired under copper thick-film firing conditions on the same foil as and at the same time as the circuit embedded capacitors. As shown in FIG. 3D, dielectric layers 320 and 325 have fused together to form sintered dielectric layer 328 and together with conductive layer 330 form first test capacitor 350.

Figure 4A:
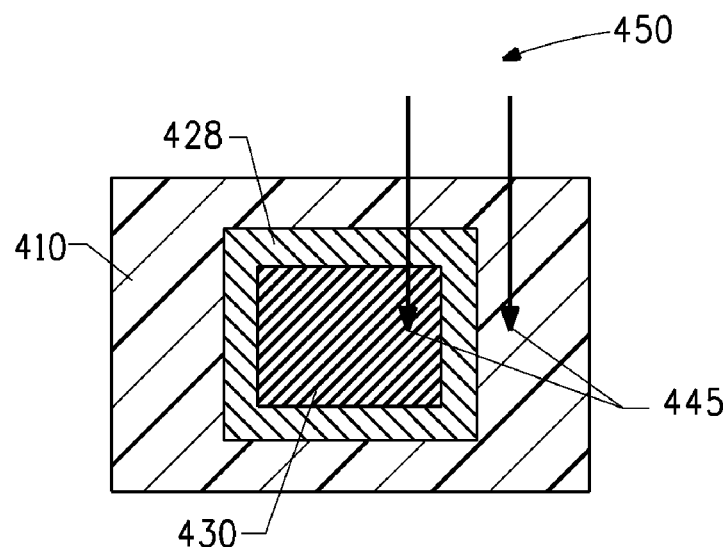
FIG. 4 depicts in plan view a foil testable test capacitor and the electrical model or schematic of the capacitor test.
Figure 4B:
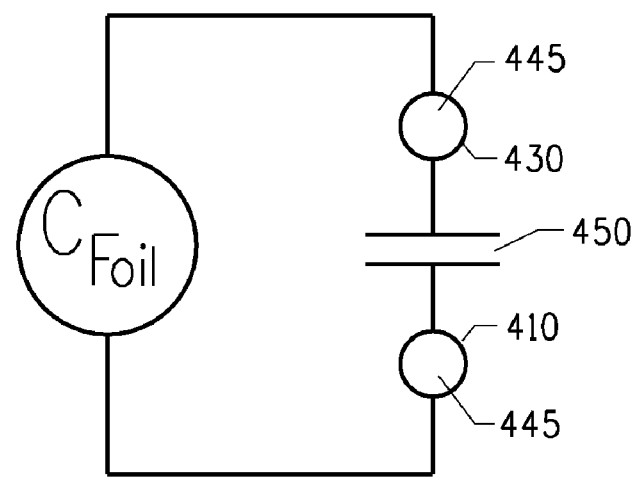

FIG. 4A shows in plan view the resulting fired-on-foil process test capacitor 450 wherein 410 is the foil (310 in FIG. 3D), 428 is the capacitor dielectric (328 in FIG. 3D) and 430 is the printed electrode (330 in FIG. 3D), which together form capacitor 450 (350 in FIG. 3D). At this stage as shown in step 219, an opportunity point arises for testing the process test capacitors. Since this testing would be done post-firing, dielectric thickness is not the measured parameter, inasmuch as capacitance, dissipation factor and insulation resistance, for example, may now be measured directly using an LCR meter. If the values of these properties are not within acceptable ranges, the foils can be discarded before continuing further manufacture. Testing at this foil stage also helps to identify possible process improvements. FIG. 4A also shows testing points 445 located at 410 in the foil and electrode 430 of capacitor 450. FIG. 4B shows the electrical schematic or model for the capacitor test, in which single capacitor 450 is tested at points 445, and $C_{FOIL}$ is the capacitance of that capacitor.

Figure 5:
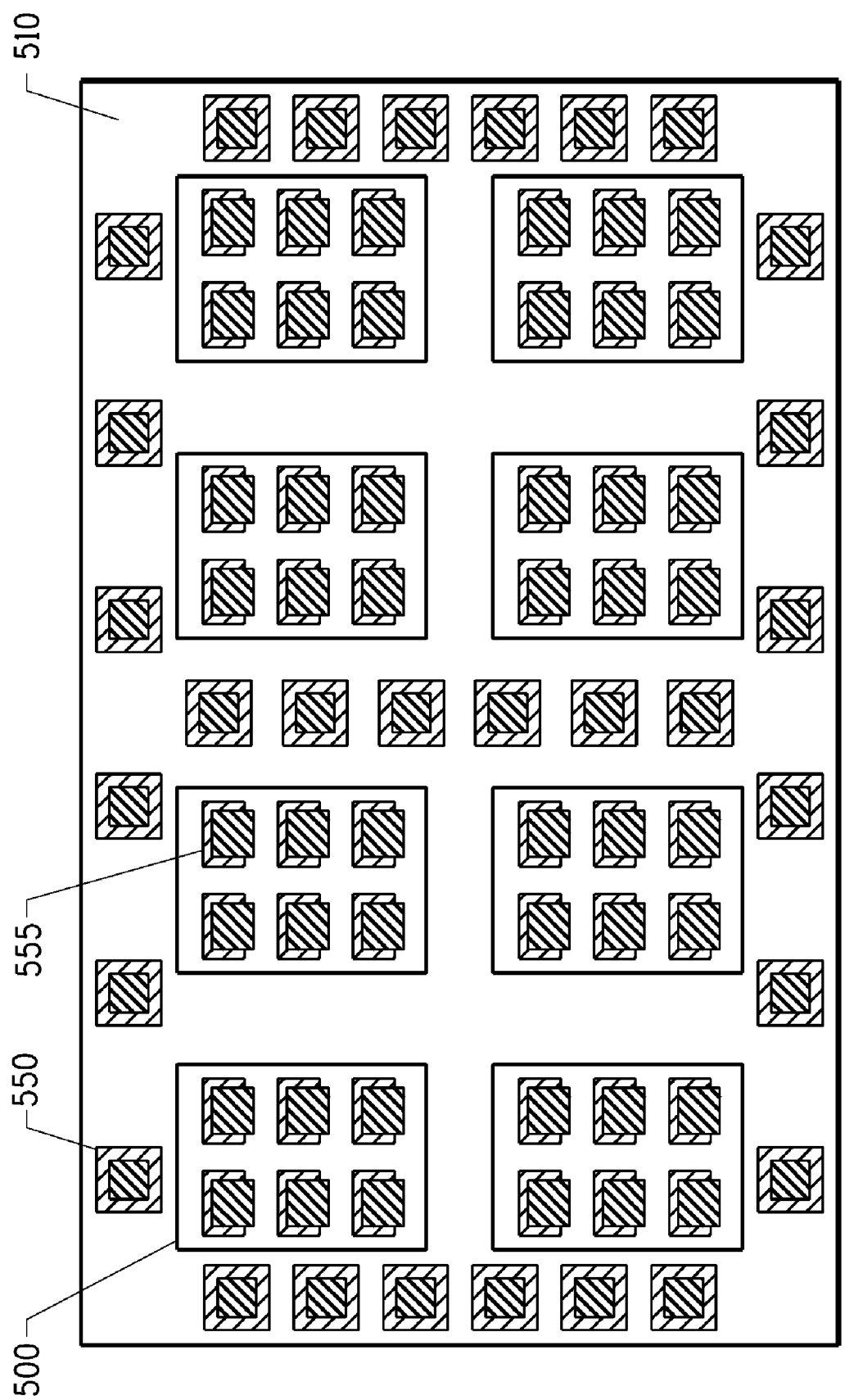
FIG. 5 illustrates a foil with circuit capacitors and test capacitors.

FIG. 5 shows an exemplary post fired metal foil 510 containing circuit capacitors 555 for embedding in the PWB circuit and test capacitors 550. As shown, the process test capacitors are situated outside that area of the circuit capacitors, which are intended for the printed wiring board circuit 500. However, other designs may situate the test capacitors within the printed wiring board circuit area.

Figure 6A:
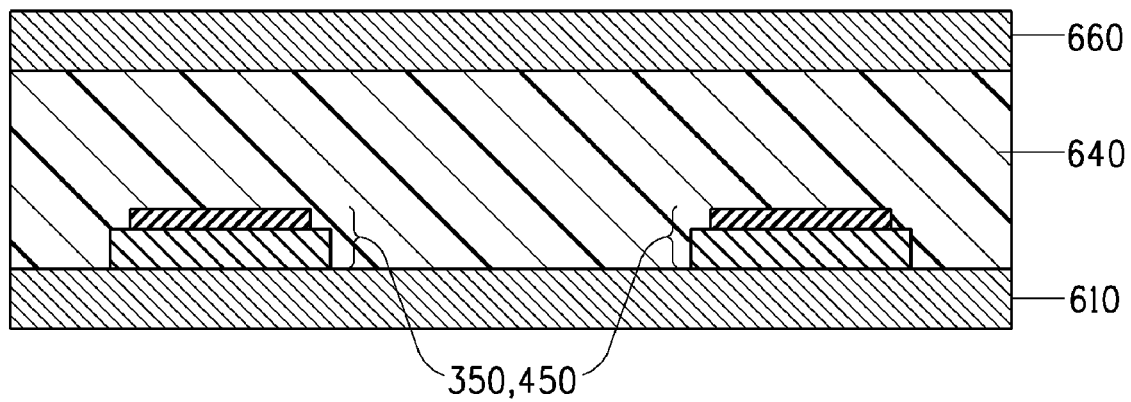
FIG. 6 illustrates the process of forming an inner layer with test capacitors and the electrical model or schematic of the capacitor test.

With continuing reference to FIG. 2, if the test values for the process test capacitors are within acceptable limits or no testing has occurred, at step 220, the capacitor side of the foil is laminated to a core material and/or prepreg. As shown in FIG. 6A, another foil 660 may be applied to the opposite side of laminate material 640 to provide a surface for creating circuitry.

Figure 6B:
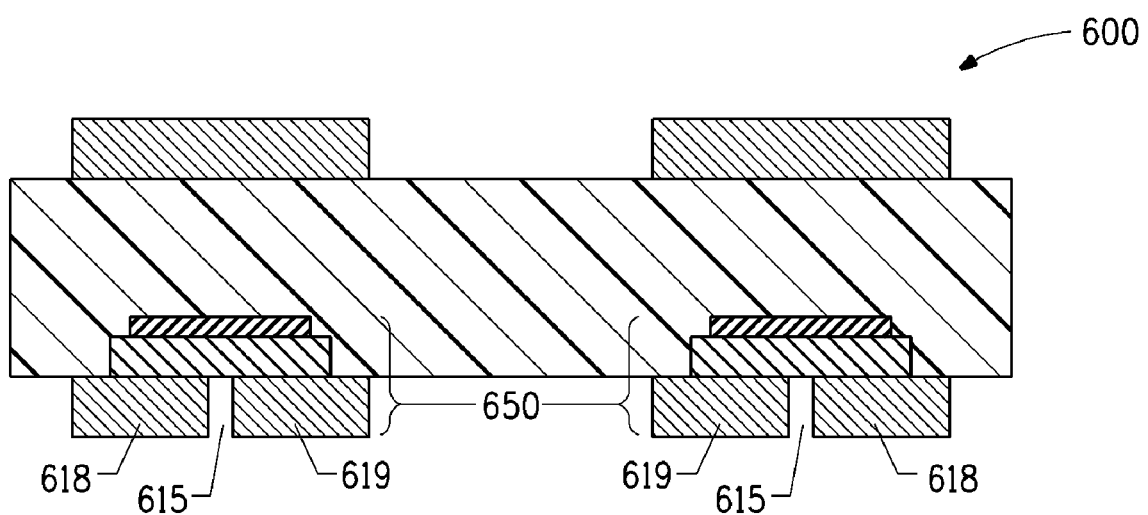

FIG. 6B depicts a method for making second process test capacitors in an inner layer panel 600 from first process capacitors 350, 450, now embedded in the article shown in FIG. 6A. Foils 610 and 660 have a photoresist applied thereto, which is imaged and developed, Thereafter foils 610 and 660 are etched at step 222 and remaining photoresist is stripped to form article 600. Etching creates trench 615 in foil 610, which results in electrodes 618 and 619 from foil 610 and creates process test capacitor 650 which constitutes two capacitors in series.

Figure 6C:
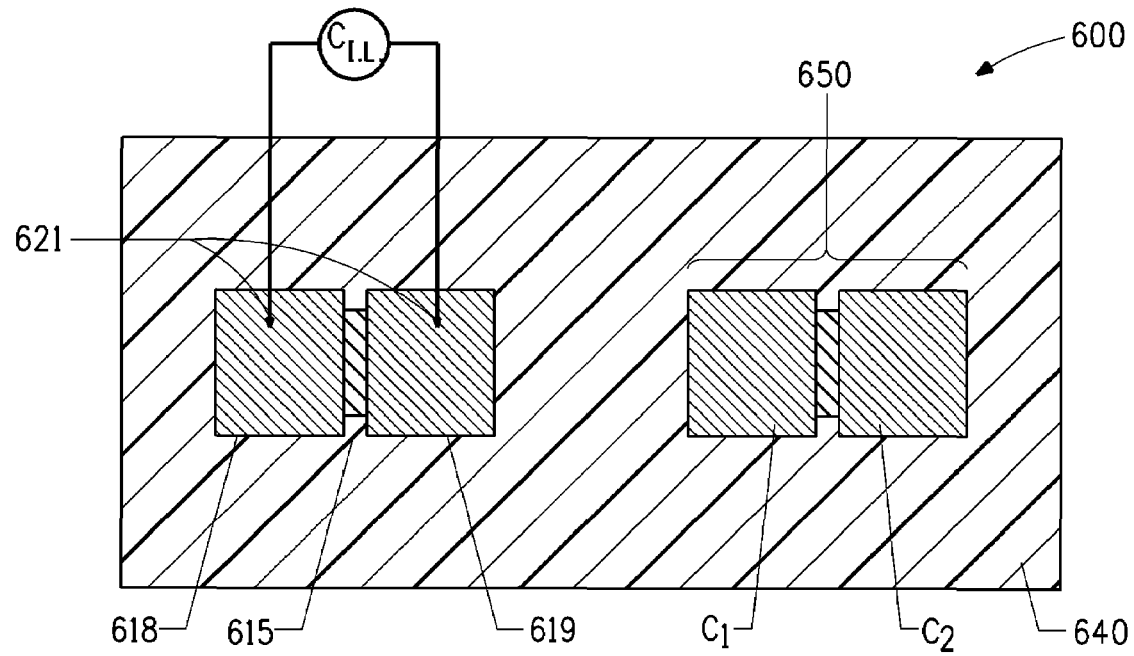
Figure 6D:
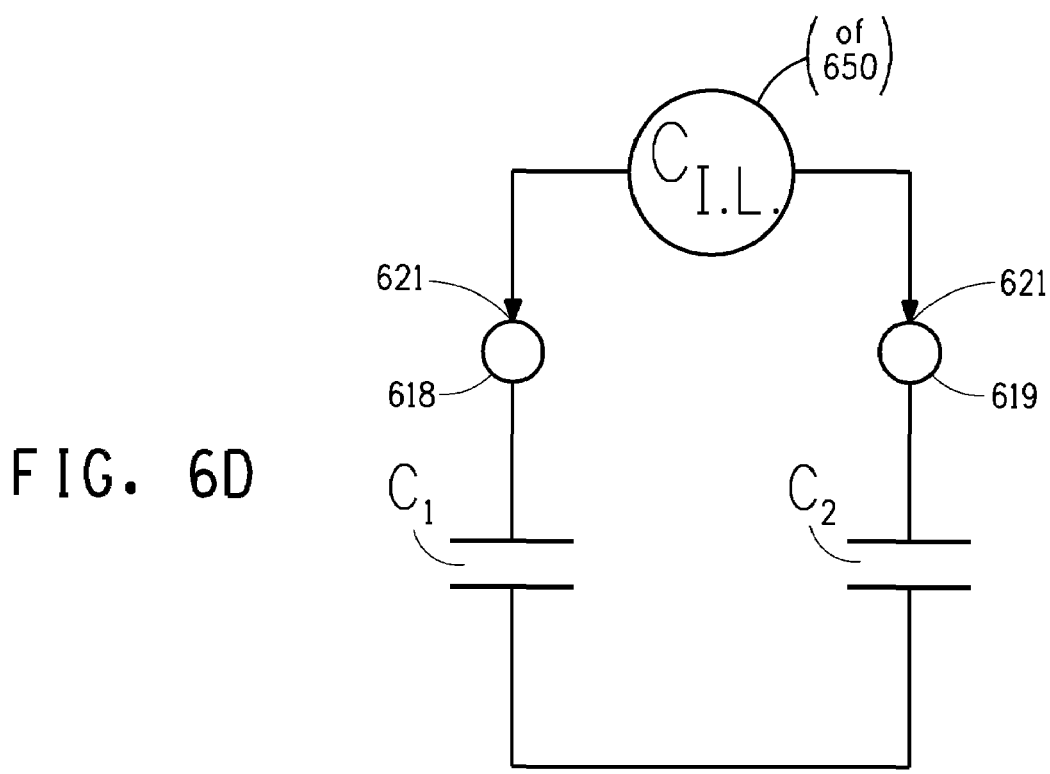

FIG. 6C shows in plan view inner layer panel 600. Capacitor 650 is depicted as two capacitors in series. With continuing reference to FIG. 2, at step 223, process test capacitor 650 may be tested. The capacitance value of capacitor 650 is identified by $C_{I.L.}$. The points for measuring the capacitance of capacitor 650 are contacts 621 to electrodes 618 and 619. FIG. 6D shows the electrical schematic or model of process test capacitor 650 in which $C_{I.L.}$ (Test capacitance at the Inner Layer Stage) is the capacitance measured from the two capacitors in series, $C_1$ and $C_2$.

The equation below gives the capacitance value of second test capacitor 650, referred to as $C_{I.L.}$, equivalent to capacitors C1 and C2 in series.

$$C_{I.L.} \cong \frac{C_{Foil}}{4}$$

where $C_{Foil}$, is the capacitance of capacitor 350/450.

Thus when tested, second test capacitor 650, that is, the test capacitor at the inner layer stage will yield capacitance values about one quarter of that expected for foil test capacitor 350 in FIG. 3D. Again, if capacitance values fall outside desired limits, the inner layers may be discarded avoiding further expense.

In addition to or instead of testing inner layer capacitor 650, the embedded circuit capacitors may also be individually tested at the inner layer stage. However, testing of the circuit capacitors may not feasible if testing results in their damage or distortion. It is therefore desirable to avoid testing the circuit capacitors and rely on testing the process test capacitors.

EXAMPLES

Examples 1-6

The foil of example 1 shown in Table 1 was produced containing embedded capacitors and process test (PT) capacitors. The PT capacitors had a common electrode area of approximately 60 mil by 60 mil. The foils were fired in an atmosphere of nitrogen at a peak temperature 930° C. for 10 minutes. After firing the foils, the PT capacitors were tested for capacitance, dissipation factor and insulation resistance (IR). The capacitance and dissipation factor was found to be within expected values. The insulation resistance, however, was found to be low at 22 megohms. The foils were discarded and the foils were remade and fired under different furnace conditions of examples 2 through 6. Example 6 showed excellent insulation resistance. Capacitance and dissipation factor were also within expected values. The foils of example 6 were then fabricated through to the inner layer stage and to the final PWB stage meeting specified requirements.

TABLE 1

Insulation Resistance for foil tested PT capacitors
(One fire 930° C. Average of 48 capacitors. IR tested at 100 V for 15 seconds)

| Example | Oxygen Dopant Level ppm Oxygen | | | IR Megaohms | Copper foil Condition |
|---|---|---|---|---|---|
| | Burnout Zone | Firing Zone | Cooling Zone | | |
| 1 | 0 | 0 | 0 | 22 | Shiny |
| 2 | 24 | 3 | 3 | 1050 | Shiny |
| 3 | 39 | 3 | 3 | 1987 | Shiny |
| 4 | 24 | 3 | 12 | 3875 | Shiny |
| 5 | 24 | 3 | 10 | 2589 | Shiny |
| 6 | 20 | 3 | 10 | 4192 | Shiny |

What is claimed is:

1. A method of making a foil testable process test capacitor, comprising:
   providing metallic foil;
   forming a process test dielectric over the metallic foil at the same time as and with the same material as are formed dielectric layers of circuit capacitors to be embedded into a printed wiring board or panel;
   forming a process test electrode, the test electrode formed over and within the area of the test dielectric at the same time and with the same material as are formed electrodes of the circuit capacitors, to result in a process test capacitor,
      the process test capacitor being a test substitute for the circuit capacitors; and
   firing the process test capacitor under copper thick-film firing conditions at the same time as are fired the circuit capacitors, to result in the foil having fired-on-foil process test capacitors.

2. A method of making an inner layer testable process test capacitor, comprising:
   laminating the foil having fired-on-foil process test capacitors of method 1 to a core, a prepreg or a combination of these, the test capacitors facing the core or prepreg; and
   etching the foil to result in functional process test capacitors.

3. A printed wiring board or a panel thereof comprising at least one process test capacitor made by the method of claim 2.

4. A printed wiring board or a panel thereof comprising at least one process test capacitor made by the method of claim 1.

5. A method of making a printed wiring board or panel thereof, comprising:
   providing a metallic foil;
   forming a process test dielectric over the metallic foil;
   forming a process test electrode over and within the area of the test dielectric to result in a process test capacitor,
      the process test capacitor being a test substitute for the circuit capacitors;
   firing the process test capacitor under copper thick-film firing conditions to result in foil having fired-on-foil process test capacitors;
   optionally laminating the foil having fired-on-foil process test capacitors to a core, a prepreg or a combination of these, the test capacitors facing the core or prepreg; and
   optionally etching the foil having fired-on-foil process test capacitors to form functional process test capacitors.

6. A printed wiring board or panel thereof formed by the method of claim 5.

7. A method of predicting whether capacitance of circuit capacitors will be within an acceptable value range prior to their embedment into a printed wiring board or panel thereof, comprising:
   setting an acceptable value range of capacitance for circuit capacitors;
   providing metallic foil;
   forming a process test dielectric over the metallic foil, the test dielectric comprising either a first dielectric layer or a first and second dielectric layer;
   drying the dielectric layer or layers;
   measuring the thickness of the first dried dielectric layer or of the first and/or second dried dielectric layer;
   calculating from the measurement of the thickness of the first dried dielectric layer or of the first and or second dried dielectric layer a predicted capacitance;
   comparing predicted capacitance to acceptable range of capacitance.

8. A method of predicting whether capacitance, dissipation factor or insulation resistance of circuit capacitors will be within acceptable value ranges prior to their embedment into a printed wiring board or panel thereof, comprising:
   setting acceptable value ranges of capacitance, dissipation factor or insulation resistance of circuit capacitors;
   making a foil testable process test capacitor, the making comprising:
   providing metallic foil;
   forming a process test dielectric over the metallic foil at the same time as and with the same material as are formed dielectric layers of circuit capacitors to be embedded into a printed wiring board or panel;

forming a process test electrode, the test electrode formed over and within the area of the test dielectric at the same time and with the same material as are formed electrodes of the circuit capacitors, to result in a foil testable process test capacitor, the process test capacitor being a test substitute for circuit capacitors; and firing the process test capacitor under copper thick-film firing conditions at the same time as are fired the circuit capacitors, to result in the foil having fired-on-foil process test capacitors;

measuring the value of capacitance, the value of dissipation factor or the value of insulation resistance of the process test capacitor with appropriate instrumentation; and comparing measured values with acceptable value ranges.

9. A method of predicting whether capacitance, dissipation factor or insulation resistance of circuit capacitors will be within acceptable value ranges prior to their embedment into a printed wiring board or panel thereof, comprising:

setting acceptable value ranges of capacitance, dissipation factor or insulation resistance of circuit capacitors;

making an inner layer testable process test capacitor, the making comprising:

providing metallic foil;

forming a process test dielectric over the metallic foil at the same time as and with the same material as are formed dielectric layers of circuit capacitors to be embedded into a printed wiring board or panel;

forming a process test electrode, the test electrode formed over and within the area of the test dielectric at the same time and with the same material as are formed electrodes of the circuit capacitors, to result in a process test capacitor, the process test capacitor being a test substitute for circuit capacitors; and firing the process test capacitor under copper thick-film firing conditions at the same time as are fired the circuit capacitors, to result in foil having fired-on-foil process test capacitors;

laminating the foil having fired-on-foil process test capacitors to a core or prepreg, the test capacitors facing the core or prepreg; and etching the foil having fired-on-foil process test capacitors to form functional process test capacitors;

measuring the value of capacitance, the value of dissipation factor or the value of insulation resistance of the functional test capacitor with appropriate instrumentation; and comparing measured values with acceptable value ranges.

* * * * *

UNITED STATES PATENT AND TRADEMARK OFFICE
CERTIFICATE OF CORRECTION

PATENT NO. : 7,649,361 B2
APPLICATION NO. : 11/612089
DATED : January 19, 2010
INVENTOR(S) : Borland et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 615 days.

Signed and Sealed this

Twenty-third Day of November, 2010

David J. Kappos
*Director of the United States Patent and Trademark Office*